United States Patent
Sung

(10) Patent No.: US 11,791,801 B2
(45) Date of Patent: Oct. 17, 2023

(54) IMPEDANCE CONTROL CIRCUIT CAPABLE OF CONFIRMING CONNECTION STATUS

(71) Applicant: Realtek Semiconductor Corp., HsinChu (TW)

(72) Inventor: Ya-Hsuan Sung, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/717,167

(22) Filed: Apr. 11, 2022

(65) Prior Publication Data
US 2022/0337227 A1    Oct. 20, 2022

(30) Foreign Application Priority Data
Apr. 15, 2021   (TW) .................................. 110113562

(51) Int. Cl.
*H03H 11/28*   (2006.01)
(52) U.S. Cl.
CPC .................................... *H03H 11/28* (2013.01)
(58) Field of Classification Search
CPC ........... G06F 2213/0042; G06F 13/382; G06F 13/4022; H03H 11/28
See application file for complete search history.

(56) References Cited

U.S. PATENT DOCUMENTS

| | | | | |
|---|---|---|---|---|
| 10,817,450 | B1 * | 10/2020 | Wei | .......................... H02H 3/20 |
| 2021/0226444 | A1 * | 7/2021 | Fang | .................. H03K 17/0822 |

FOREIGN PATENT DOCUMENTS

TW            202107296 A        2/2021

* cited by examiner

*Primary Examiner* — Patrick C Chen
(74) *Attorney, Agent, or Firm* — Winston Hsu

(57) ABSTRACT

An impedance control circuit includes a configuration channel interface, three resistors and two transistors. The configuration channel interface is coupled to a universal serial bus device. The first resistor has a first terminal coupled to the configuration channel interface. The first transistor has a first terminal coupled to a second terminal of the first resistor, and a second terminal coupled to a system voltage terminal. The second transistor has a first terminal coupled to the second terminal of the first resistor, and a second terminal coupled to the system voltage terminal. The second resistor has a first terminal coupled to the second terminal of the first resistor, and a second terminal coupled to a control terminal of the second transistor. The third resistor has a first terminal coupled to the second terminal of the second resistor, and a second terminal coupled to the system voltage terminal.

9 Claims, 3 Drawing Sheets

IMPEDANCE CONTROL CIRCUIT CAPABLE OF CONFIRMING CONNECTION STATUS

BACKGROUND OF THE INVENTION

1. Field of the Invention

The present invention relates to an impedance control circuit, in particular to an impedance control circuit that can control the impedance so that the universal serial bus device can confirm the connection status.

2. Description of the Prior Art

Type-C Universal Serial Bus (USB) has a symmetrical fool-proof structure and can support a variety of data transmission applications, so it has been widely used in various electronic devices. FIG. 1 is a schematic diagram of the configuration channel (CC) connection when the electronic devices A1 and A2 are connected through a Type-C universal serial bus in the prior art.

In FIG. 1, the electronic device A1 is used as a downstream face port (DFP) of the universal serial bus, and the electronic device A2 is used as an upstream face port (UFP) of the universal serial bus. In this case, the electronic device A1 couples the resistor Rp1 to the configuration channel interface CCP1 of the electronic device A1, and the electronic device A2 couples the resistor Rd2 to the configuration channel interface CCP2 of the electronic device A2. In addition, the electronic device A1 applies an operating voltage VDD, such as a voltage of 3.3V, to one end of the resistor Rp1, and detects the voltage of the configuration channel interface CCP1. If the configuration channel interface CCP2 can provide matching impedance, the partial voltage generated by the resistance Rp1 and the resistance Rd2 will make the voltage of the configuration channel interface CCP1 fall within the predetermined voltage range, and the electronic device A1 will determine the electronic device A2 at this time has been coupled to the electronic device A1 through the universal serial bus, so it will start to provide power to the electronic device A2 through the universal serial bus.

However, since both electronic devices A1 and A2 may be used as downstream face ports or upstream face ports, the configuration channel interface CCP1 of the electronic device A1 may also be coupled to the resistor Rd1, and the configuration channel interface CCP2 may also be coupled to the resistor Rp2. In the prior art, since the electronic device A1 only provides power to the electronic device A2 after confirming that the electronic device A2 has been coupled to the electronic device A1, if the electronic device A2 in the previous state did not couple the resistor Rd2 to the configuration channel interface CCP2, but coupled the resistance Rp2 to the configuration channel interface CCP2, then the electronic device A2 would not be able to switch its resistor without receiving power. In this way, the electronic device A1 will determine that the electronic device A2 is not coupled to the electronic device A1, so that the electronic device A2 cannot be detected and used, and a deadlock in the system is formed.

SUMMARY OF THE INVENTION

An embodiment discloses an impedance control circuit. The impedance control circuit comprises a configuration channel interface, a first resistor, a first transistor, a second transistor, a second resistor and a third resistor. The configuration channel interface is coupled to a first universal serial bus device. The first resistor has a first terminal coupled to the configuration channel interface, and a second terminal. The first transistor has a first terminal coupled to the second terminal of the first resistor, a second terminal coupled to a system voltage terminal, and a control terminal. The second transistor has a first terminal coupled to the second terminal of the first resistor, a second terminal coupled to the system voltage terminal, and a control terminal. The second resistor has a first terminal coupled to the second terminal of the first resistor, and a second terminal coupled to the control terminal of the second transistor. The third resistor has a first terminal coupled to the second terminal of the second resistor, and a second terminal coupled to the system voltage terminal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
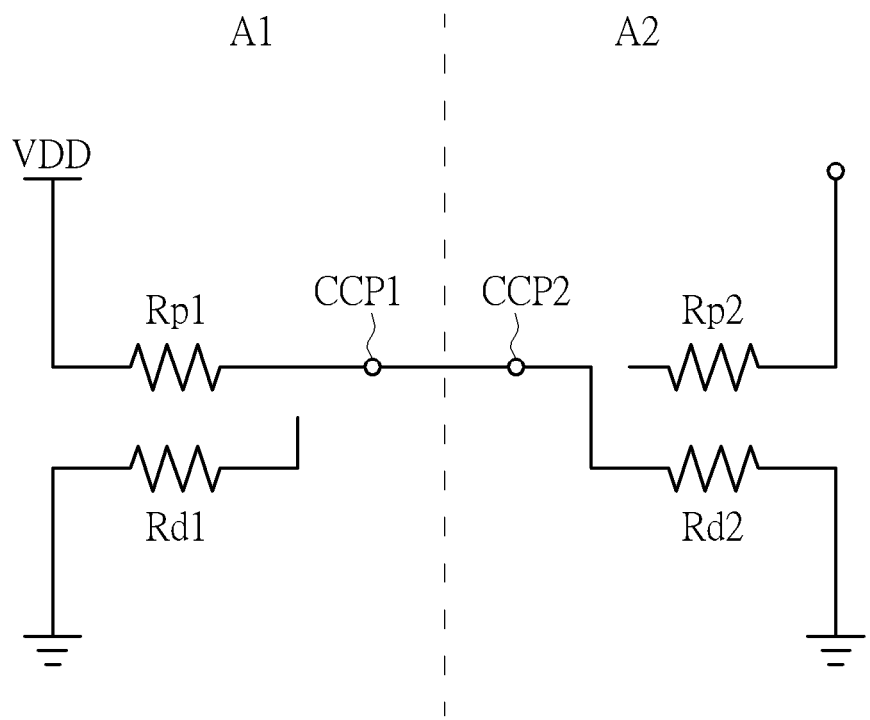
FIG. 1 is a schematic diagram of the configuration channel connection when electronic devices are connected through a Type-C universal serial bus in the prior art.
Figure 2:
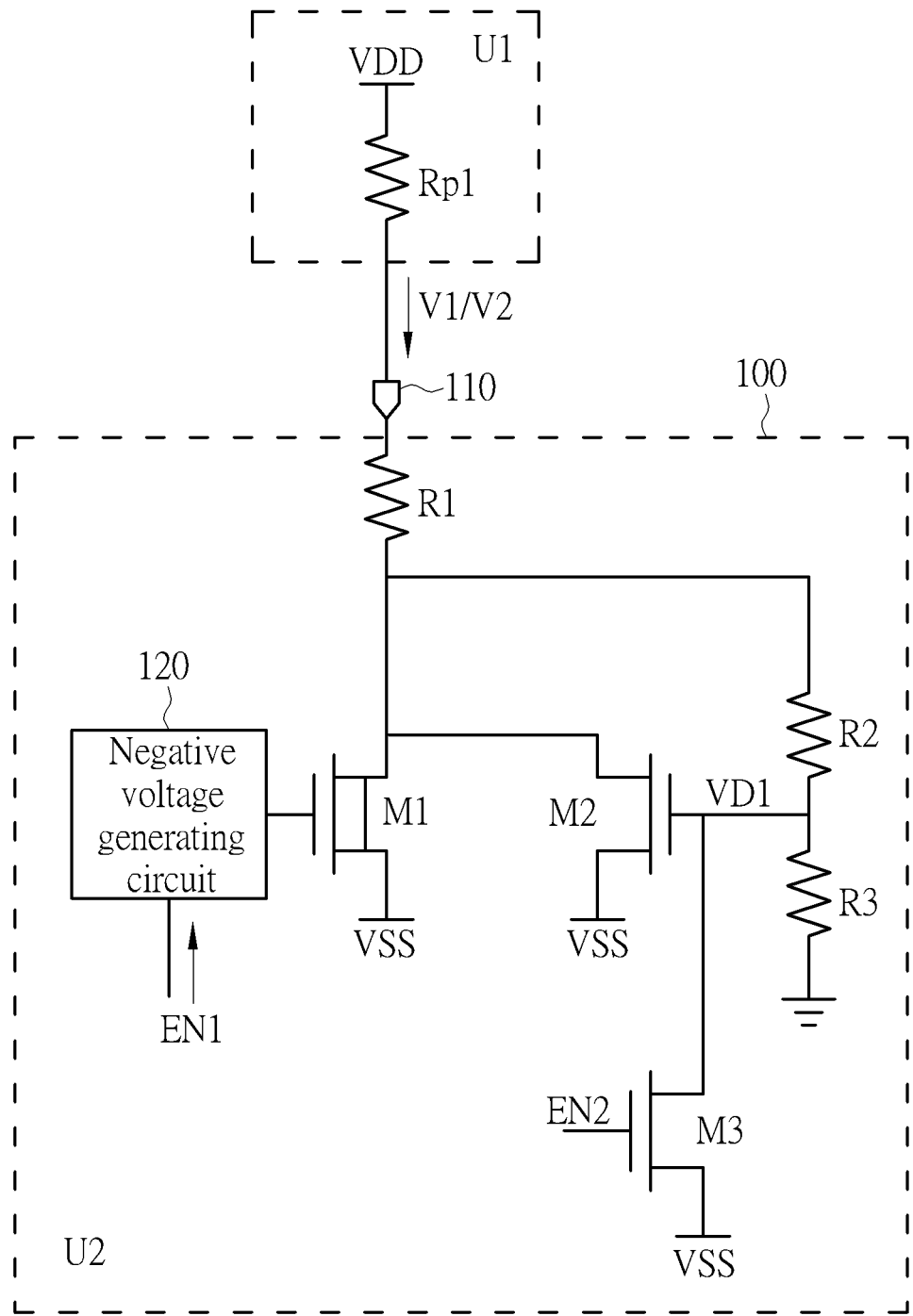
FIG. 2 is a schematic diagram of an impedance control circuit according to an embodiment of the present invention.

FIG. 2 is a schematic diagram of an impedance control circuit 100 according to an embodiment of the present invention. The impedance control circuit 100 comprises a configuration channel (CC) interface 110, a resistor R1, a transistor M1, a transistor M2, a resistor R2, and a resistor R3. In some embodiments, the impedance control circuit 100 may be provided in a universal serial bus (USB) device U2. When the universal serial bus device U2 and the universal serial bus device U1 are coupled, the configuration channel interface 110 can be coupled to the configuration channel interface of the universal serial bus device U1, and can provide matching impedance, so that the universal serial bus device U1 can confirm that the universal serial bus device U2 is connected to the universal serial bus device U1, and perform subsequent operations.

In FIG. 2, the resistor R1 has a first end and a second end, and the first end of the resistor R1 can be coupled to the configuration channel interface 110. The transistor M1 has a first terminal, a second terminal and a control terminal. The first terminal of the transistor M1 can be coupled to the second terminal of the resistor R1, and the second terminal of the transistor M1 can be coupled to the system voltage terminal VSS. The transistor M2 has a first terminal, a second terminal and a control terminal. The first terminal of the transistor M2 can be coupled to the second terminal of the resistor R1, and the second terminal of the transistor M2 can be coupled to the system voltage terminal VSS. The resistor R2 has a first terminal and a second terminal. The first terminal of the resistor R2 can be coupled to the second terminal of the resistor R1, and the second terminal of the resistor R2 can be coupled to the control terminal of the transistor M2. The resistor R3 has a first terminal and a second terminal. The first terminal of the resistor R3 can be coupled to the second terminal of the resistor R2, and the second terminal of the resistor R3 can be coupled to the system voltage terminal VSS.

In addition, in some embodiments, the threshold voltage of the transistor M1 may be a negative value, and the threshold voltage of the transistor M2 may be a positive value. That is to say, the transistor M1 is turned on when the control terminal does not receive a specific voltage, and the transistor M2 will remain in the off state when the control terminal does not receive a specific voltage. In this way, when the universal serial bus device U1 is coupled to the configuration channel interface 110 of the impedance control circuit 100, if the universal serial bus device U1 has applied the operating voltage VDD to one end of the internal resistor Rp1, the impedance at the configuration channel interface 110 of the impedance control circuit 100 will be at a corresponding divided voltage, such as the first voltage V1, according to the resistor Rp1 and the internal impedance provided by itself. In some embodiments, the operating voltage VDD can be, for example, but not limited to 3.3 volts (V). The resistance of the resistor R1 can be, for example, but not limited to 5.1 k ohms. The resistance of the resistor Rp1 can be, for example, but not limited to 36 k ohms. In this case, the first voltage V1 is about 0.4 volts because the transistor M1 will be turned on and the transistor M2 will be turned off. Therefore, the impedance of the impedance control circuit 100 is approximately equal to the resistance of the resistor R1.

However, in some embodiments, the universal serial bus device U1 provides different power supply modes, and different pull-up resistors may be used to determine whether the universal serial bus device U2 matches the universal serial bus device U1. For example, according to the regulations of the Universal Serial Bus Association, when a preset power mode is to be provided, the universal serial bus device U1 can use a 36 k ohm resistor. If it is detected that the voltage of the configuration channel interface 110 is between 0.25 volts and 1.5 volts, it implies that the universal serial bus device U2 is a matched device. When the power supply mode is 5 volts and 1.5 amperes, the universal serial bus device U1 may use a 12 k ohm resistor Rp1, and if it is detected that the voltage of the configuration channel interface 110 is between 0.45V and 1.5V, it implies that the universal serial bus device U2 is a matched device. In addition, when the power supply mode is 5 volts and 3 amps, the universal serial bus device U1 may use a 4.7 k ohm resistor Rp1, and if it is detected that the voltage of the configuration channel interface 110 is between 0.85V and 2.45V, it implies that the universal serial bus device U2 is a matched device.

In this case, when the universal serial bus device U1 uses a smaller resistor Rp1, for example, when the resistance is 12 k ohms or 4.7 k ohms, since the resistances of the resistor Rp1 and the resistor R1 are relatively close, the configuration channel interface 110 will be at a higher second voltage V2. At this time, the transistor M1 will enter the inversion saturation state or close to the cut-off state. However, since the second voltage V2 is relatively high, the divided voltage VD1 provided between the resistor R2 and the resistor R3 can turn on the transistor M2. In this way, the configuration channel interface 110 can still be configured through the resistor R1 and the transistor M2, providing an impedance close to the resistor R1.

In some embodiments, in order to prevent the resistor R2 and the resistor R3 from affecting the impedance provided by the configuration channel interface 110, the resistor R2 and the resistor R3 with larger resistances can be selected. For example, the resistance of the resistor R2 and the resistance of the resistor R3 can be greater than ten times the resistance of the resistor R1. In some embodiments, the resistances of the resistor R2 and the resistor R3 can be, for example, but not limited to, 500$k$ ohms.

Through the impedance control circuit 100, when the universal serial bus device U2 has not received power, it can automatically turn on the transistor M1 or the transistor M2 according to the different voltages of the configuration channel interface 110 to enable the universal serial bus device U1 to successfully confirm its connection state with the universal serial bus device U2. For example, when the universal serial bus device U1 detects that the voltage of the configuration channel interface 110 is within the predetermined range specified by the universal serial bus device, the universal serial bus device U1 can confirm the connection between the two, and can provide power to the universal serial bus device U2 via the bus power interface.

In some embodiments, after the universal serial bus device U1 starts to provide power to the universal serial bus device U2, the impedance control circuit 100 must be changed to provide high impedance to facilitate other subsequent operations. In the embodiment of FIG. 2, the impedance control circuit 100 may further comprise a negative voltage generating circuit 120 and a transistor M3. The negative voltage generating circuit 120 can be coupled to the control terminal of the transistor M1, and can generate a negative voltage to the control terminal of the transistor M1 according to the first enabling signal EN1 to turn off the transistor M1. The transistor M3 has a first terminal, a second terminal and a control terminal. The first terminal of the transistor M3 can be coupled to the control terminal of the transistor M2, and the second terminal of the transistor M3 can be coupled to the system voltage terminal VSS, and the control terminal of the transistor M3 can receive the second enabling signal EN2. In some embodiments, when the control terminal of the transistor M3 receives the second enabling signal EN2, the transistor M3 will be turned on. At this time, the control terminal of the transistor M2 will be coupled to the system voltage terminal VSS, so that the transistor M2 is cut off.

In other words, when the universal serial bus device U2 receives the power provided by the universal serial bus device U1, it can generate the first enabling signal EN1 and the second enabling signal EN2 to turn on the transistor M1 and turn off the transistor M2. In this way, after the universal serial bus device U2 receives the power provided by the universal serial bus device U1, the impedance control circuit 100 can provide high impedance at the configuration channel interface 110 to facilitate subsequent operations. In some embodiments, the first enabling signal EN1 and the second enabling signal EN2 may be different signals or the same signal generated by the same circuit, or may be different signals generated by different circuits.

Figure 3:
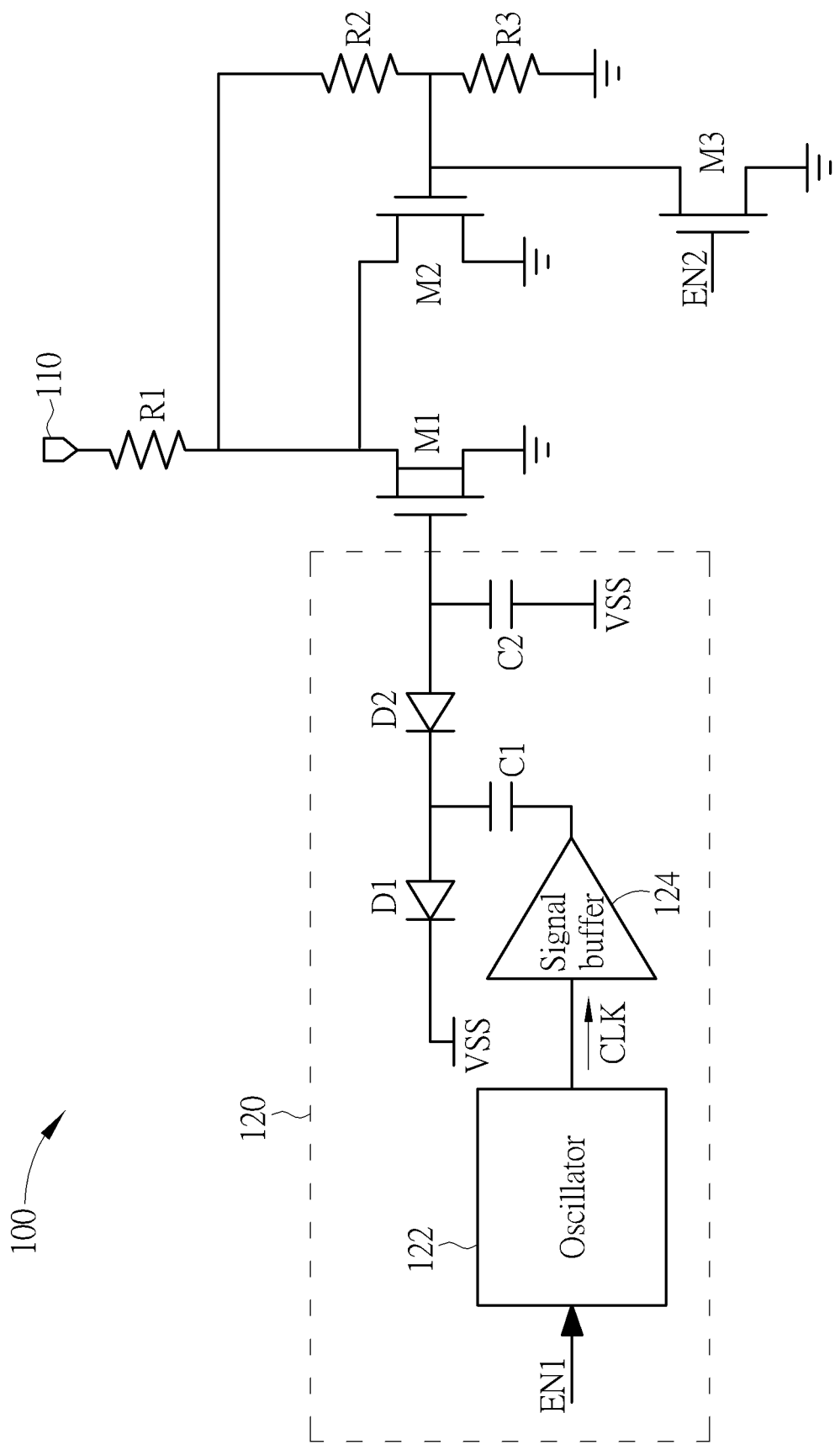
FIG. 3 is a schematic diagram of a negative voltage generating circuit of the impedance control circuit in FIG. 2.

FIG. 3 is a schematic diagram of the negative voltage generating circuit 120 according to an embodiment of the present invention. In FIG. 3, the negative voltage generating circuit 120 may include an oscillator 122, a capacitor C1, a diode D1, a capacitor C2, and a diode D2. The oscillator 122 can generate the clock signal CLK according to the first enabling signal EN1. The capacitor C1 has a first terminal and a second terminal, and the first terminal of the capacitor C1 can receive the clock signal CLK. The diode D1 has an anode and a cathode. The anode of the diode D1 can be coupled to the second terminal of the capacitor C1, and the cathode of the diode D1 can be coupled to the system voltage terminal VSS. The diode D2 has an anode and a cathode. The anode of the diode D2 can be coupled to the control terminal of the transistor M1, and the cathode of the diode D2 can be coupled to the second end of the capacitor C1. The capacitor C2 has a first terminal and a second terminal. The first terminal of the capacitor C2 can be coupled to the anode of the diode D2, and the second terminal of the capacitor C2 can be coupled to the system voltage terminal VSS.

In this case, when the clock signal CLK is at a high potential, the capacitor C1 will be charged, so that the first terminal of the capacitor C1 is at a high potential, and the second end of the capacitor C1 is maintained at a voltage close to the system voltage terminal VSS due to the diode D1. When the clock signal CLK goes low, the second terminal of the capacitor C1 will become a negative voltage. At this time, the diode D2 will be turned on, and the first terminal of the capacitor C2 will also be pulled down to a negative voltage. In this way, after the clock signal CLK continues to change between the high potential and the low potential, a negative voltage can be generated at the control terminal of the transistor M1, and the transistor M1 can be turned off.

In addition, in the embodiment of FIG. 3, the negative voltage generating circuit 120 may further comprise a signal buffer 124. The signal buffer 124 can be coupled between the oscillator 122 and the capacitor C1, and can receive and output the clock signal CLK. However, in some embodiments, if the oscillator 122 can provide a clock signal CLK with sufficient driving capability, the signal buffer 124 can also be omitted. Furthermore, the present invention is not limited to the structure shown in FIG. 3 to implement the negative voltage generating circuit 120. In some other embodiments, the negative voltage generating circuit 120 can also be implemented by other structures or by comprising other components according to the requirements of the system.

In summary, the impedance control circuit provided by the embodiment of the present invention can provide stable impedance at the configuration channel interface when no external power is received. In this way, regardless of the power configuration used by the universal serial bus device coupled to the impedance control circuit, the universal serial bus device can successfully confirm the connection between the two universal serial bus devices and start to provide power.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An impedance control circuit comprising:
a configuration channel interface coupled to a first universal serial bus device;
a first resistor having a first terminal coupled to the configuration channel interface, and a second terminal;
a first transistor having a first terminal coupled to the second terminal of the first resistor, a second terminal coupled to a system voltage terminal, and a control terminal, wherein the first transistor has a negative threshold voltage;
a second transistor having a first terminal coupled to the second terminal of the first resistor, a second terminal coupled to the system voltage terminal, and a control terminal, wherein the second transistor has a positive threshold voltage;
a second resistor having a first terminal coupled to the second terminal of the first resistor, and a second terminal coupled to the control terminal of the second transistor; and
a third resistor having a first terminal coupled to the second terminal of the second resistor, and a second terminal coupled to the system voltage terminal.

2. The impedance control circuit of claim 1 wherein:
when the configuration channel interface is at a first voltage, the first transistor is turned on, and the second transistor is turned off;
when the configuration channel interface is at a second voltage, the second transistor is turned on; and
the second voltage is higher than the first voltage.

3. The impedance control circuit of claim 1 wherein a resistance of the first resistor is 5.1 kΩ.

4. The impedance control circuit of claim 1 wherein resistances of the second resistor and the third resistor are greater than ten times a resistance of the first resistor.

5. The impedance control circuit of claim 1 further comprising a third transistor having a first terminal coupled to the control terminal of the second transistor, a second terminal coupled to the system voltage terminal, and a control terminal for receiving a second enabling signal.

6. The impedance control circuit of claim 1 wherein:
the impedance control circuit is disposed in a second universal serial bus device; and
when the first universal serial bus device detects that a voltage at the configuration channel interface is in a predetermined range, the first universal serial bus device provides a power to the second universal serial bus device through a bus power pin.

7. An impedance control circuit comprising:
a configuration channel interface coupled to a first universal serial bus device;
a first resistor having a first terminal coupled to the configuration channel interface, and a second terminal;
a first transistor having a first terminal coupled to the second terminal of the first resistor, a second terminal coupled to a system voltage terminal, and a control terminal;
a second transistor having a first terminal coupled to the second terminal of the first resistor, a second terminal coupled to the system voltage terminal, and a control terminal;
a second resistor having a first terminal coupled to the second terminal of the first resistor, and a second terminal coupled to the control terminal of the second transistor;
a third resistor having a first terminal coupled to the second terminal of the second resistor, and a second terminal coupled to the system voltage terminal; and
a negative voltage generating circuit coupled to the control terminal of the first transistor, and configured to generate a negative voltage to the control terminal of the first transistor according to a first enabling signal to turn off the first transistor.

8. The impedance control circuit of claim 7 wherein the negative voltage generating circuit comprises:
an oscillator configured to generate a clock signal according to the first enabling signal;
a first capacitor having a first terminal for receiving the clock signal, and a second terminal;
a first diode having an anode coupled to the second terminal of the first capacitor, and a cathode coupled to the system voltage terminal;

a second diode having an anode coupled to the control terminal of the first transistor, and a cathode coupled to the second terminal of the first capacitor; and a second capacitor having a first terminal coupled to the anode of the second diode, and a second terminal coupled to the system voltage terminal.

9. The impedance control circuit of claim 8 wherein the negative voltage generating circuit further comprises:

a signal buffer coupled between the oscillator and the first capacitor, and configured to receive and output the clock signal.

\* \* \* \* \*